(12) United States Patent
Choi et al.

(10) Patent No.: US 11,723,203 B2
(45) Date of Patent: Aug. 8, 2023

(54) METHOD OF MANUFACTURING THREE DIMENSIONAL SEMICONDUCTOR DEVICE INCLUDING FIRST AND SECOND CHANNELS AND BURIED INSULATION AND CONDUCTIVE PATTERNS

(71) Applicant: Samsung Electronics Co., Ltd., Suwon-si (KR)

(72) Inventors: Eun Yeoung Choi, Suwon-si (KR); Hyung Joon Kim, Suwon-si (KR); Su Hyeong Lee, Suwon-si (KR); Yong Seok Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 41 days.

(21) Appl. No.: 17/540,688

(22) Filed: Dec. 2, 2021

(65) Prior Publication Data

US 2022/0093642 A1 Mar. 24, 2022

Related U.S. Application Data

(63) Continuation of application No. 16/582,240, filed on Sep. 25, 2019, now Pat. No. 11,201,166.

(30) Foreign Application Priority Data

May 31, 2019 (KR) .................... 10-2019-0064724

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS

| 8,637,913 | B2 | 1/2014 | Yoo et al. |
| 8,772,859 | B2 | 7/2014 | Higuchi |
| 8,912,594 | B2 | 12/2014 | Fujiki et al. |
| 9,087,735 | B2 | 7/2015 | Lee et al. |
| 9,111,617 | B2 | 8/2015 | Shim et al. |

(Continued)

OTHER PUBLICATIONS

Office Action dated Mar. 12, 2021 for corresponding U.S. Appl. No. 16/582,240.

(Continued)

*Primary Examiner* — Nduka E Ojeh
(74) *Attorney, Agent, or Firm* — Harness, Dickey & Pierce, P.L.C.

(57) ABSTRACT

A semiconductor device includes a plurality of first gate electrodes sequentially stacked on a substrate, a second gate electrode on the plurality of first gate electrodes, a first channel structure extending through the plurality of first gate electrodes and a portion of the second gate electrode, a buried insulation pattern on a sidewall of the first channel structure, of which an upper surface is at a higher level than a top end of the first channel structure, a second channel structure extending through a remainder of the second gate electrode, the second channel structure connected to the first channel structure, and a buried conductive pattern on a sidewall of the second channel structure.

20 Claims, 21 Drawing Sheets

(56) References Cited

U.S. PATENT DOCUMENTS

| | | | |
|---|---|---|---|
| 9,209,199 B2 | 12/2015 | Simsek-Ege et al. | |
| 9,536,894 B2 | 1/2017 | Tajima et al. | |
| 9,583,505 B2 | 2/2017 | Ishida et al. | |
| 9,853,047 B2 | 12/2017 | Choi | |
| 10,096,617 B2 | 10/2018 | Lee et al. | |
| 10,937,803 B2 | 3/2021 | Kashima et al. | |
| 2010/0207194 A1 | 8/2010 | Tanaka et al. | |
| 2010/0244119 A1* | 9/2010 | Fukuzumi | H01L 21/265 |
| | | | 257/E21.423 |
| 2012/0008400 A1 | 1/2012 | Fukuzumi et al. | |
| 2013/0056814 A1* | 3/2013 | Higuchi | H10B 43/27 |
| | | | 257/314 |
| 2014/0264547 A1* | 9/2014 | Kawai | H10B 43/27 |
| | | | 438/287 |
| 2017/0194057 A1 | 7/2017 | Lee et al. | |
| 2018/0308859 A1 | 10/2018 | Choi et al. | |
| 2020/0144284 A1 | 5/2020 | Choi et al. | |

OTHER PUBLICATIONS

Notice of Allowance dated Jul. 29, 2021 for corresponding U.S. Appl. No. 16/582,240.

* cited by examiner

METHOD OF MANUFACTURING THREE DIMENSIONAL SEMICONDUCTOR DEVICE INCLUDING FIRST AND SECOND CHANNELS AND BURIED INSULATION AND CONDUCTIVE PATTERNS

CROSS-REFERENCE TO RELATED APPLICATION

This application is a continuation of U.S. application Ser. No. 16/582,240, filed Sep. 25, 2019, which claims benefit of priority to Korean Patent Application No. 10-2019-0064724 filed on May 31, 2019 in the Korean Intellectual Property Office, the disclosure of which is hereby incorporated by reference in its entirety.

TECHNICAL FIELD

Example embodiments of the present disclosure relate to three dimensional semiconductor devices and methods of manufacturing the same.

DISCUSSION OF RELATED ART

Although the volume of an electronic devices are getting smaller, the electronic devices require a high volume of data processing. A semiconductor device used in such an electronic device should be highly integrated. To provide a highly integrated semiconductor device, a three dimensional semiconductor device having a three dimensional (e.g., a vertical) transistor instead of a planar transistor may be desired.

SUMMARY

According to some example embodiments of the inventive concepts, a three dimensional semiconductor device may include a substrate, a plurality of first gate electrodes sequentially stacked on the substrate, a second gate electrode on the plurality of first gate electrodes, a first channel structure extending through the plurality of first gate electrodes and a portion of the second gate electrode, a buried insulation pattern disposed on a sidewall of the first channel structure and having an upper surface at a higher level than a top end of the first channel structure, a second channel structure extending through a remainder of the second gate electrode and connected to the first channel structure, and a buried conductive pattern on a sidewall of the second channel structure.

According to some example embodiments of the inventive concepts, a three dimensional semiconductor device may include a substrate, a plurality of first gate electrodes sequentially stacked on the substrate, a second gate electrode including a lower gate electrode and an upper gate electrode that are sequentially stacked on the plurality of first gate electrodes, a first channel structure extending through the plurality of first gate electrodes and a portion of the lower gate electrode, a buried insulation pattern disposed on a sidewall of the first channel structure and having an upper surface at a higher level than a top end of the first channel structure, a second channel structure extending through a remainder of the second gate electrode and connected to the first channel structure, and a buried conductive pattern on a sidewall of the second channel structure, the buried conductive pattern spaced apart from the buried insulation pattern.

According to some example embodiments of the inventive concepts, a three dimensional semiconductor device may include a substrate, a stack structure including a plurality of first gate electrodes stacked on the substrate, at least one second gate electrode on the plurality of first gate electrodes, and a channel hole passing through the plurality of first gate electrodes and the at least one second gate electrode, a first channel structure disposed on an inner sidewall of the channel hole and overlapped with the plurality of first gate electrodes and a first portion of the at least one second gate electrode in a horizontal direction parallel to an upper surface of the substrate, a first buried insulation pattern, in the channel hole, on a sidewall of the first channel structure, the first buried insulation pattern having an upper surface at a higher level than a top end of the first channel structure, a second channel structure disposed on the inner sidewall of the channel hole and on the top end of the first channel structure and including a channel layer overlapped with a second portion of the at least one second gate electrode in the horizontal direction and an intermediate horizontal layer on the upper surface of the first buried insulation pattern, a second buried insulation pattern, in the channel hole, on the intermediate horizontal layer of the second channel structure and a sidewall of the channel layer of the second channel structure, and a buried conductive pattern, in the channel hole, on the second buried insulation pattern and the sidewall of the channel layer of the second channel structure.

According to some example embodiments of the inventive concepts, a method of manufacturing a three dimensional semiconductor device may include forming a structure including insulation layers and sacrificial layers alternately stacked on a substrate, forming a channel hole passing through the structure, forming a first channel structure on an inner sidewall of the channel hole, forming a buried insulation pattern on the first channel structure in the channel hole, recessing an upper surface of the buried insulation pattern, removing a portion of the first channel structure, such that a top end of the first channel structure is recessed lower than the recessed upper surface of the buried insulation pattern, forming a second channel structure on the recessed top end of the first channel structure and the recessed upper surface of the buried insulation pattern in the channel hole, and forming a buried conductive pattern on the second channel structure in the channel hole.

DETAILED DESCRIPTION

Figure 1:
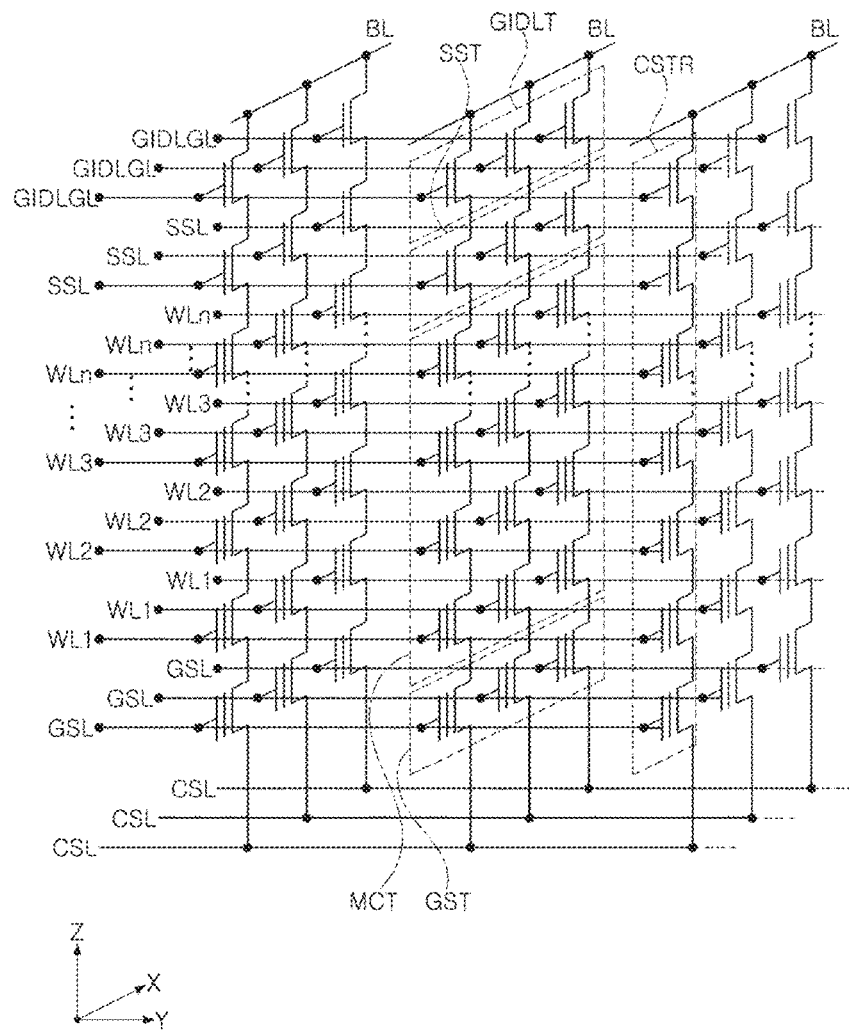
FIG. 1 is an equivalent circuit diagram of a memory cell array of a three dimensional semiconductor device according to example embodiments of the inventive concepts.

Various example embodiments will now be described more fully hereinafter with reference to the accompanying drawings. Like reference numerals may refer to like elements throughout this application.

Figure 2:
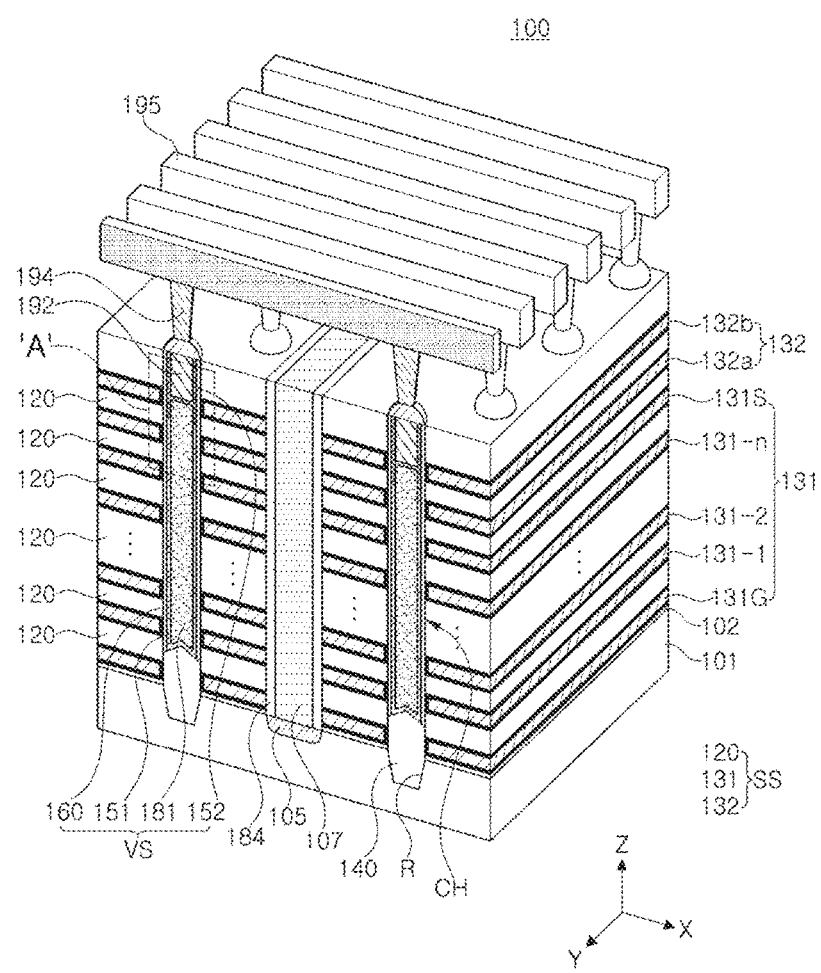
FIG. 2 is a schematic perspective view illustrating a three dimensional semiconductor device according to example embodiments of the inventive concepts.

FIG. 1 is an equivalent circuit diagram of a memory cell array of a three dimensional (3D) semiconductor device according to example embodiments of the inventive concepts and may be understood as an equivalent circuit diagram of a memory cell array included in the 3D semiconductor device of FIG. 2.

Referring to FIG. 1, a memory cell array of a 3D semiconductor device may include a common source line CSL, a plurality of bit lines BL, and/or a plurality of cell strings CSTR between the common source line CSL and the bit lines BL.

The common source line CSL may be a conductive layer on a substrate and an impurity region in the substrate. The bit lines BL may be conductive patterns (e.g., metal lines) over the substrate. The bit lines BL may be arranged in two dimensions. The plurality of cell strings CSTR may be connected in parallel to each of the bit lines BL. The plurality of cell strings CSTR may be commonly connected to the common source line CSL. The plurality of cell strings CSTR may be disposed between the common source line CSL and the plurality of bit lines BL. In some example embodiments, the common source line CSL may include a plurality of common source lines arranged in two dimensions. Here, a same voltage may be applied to the common source lines CSL, or each of the common source lines CSL may be separately electrically controlled.

Each of the cell strings CSTR may include a ground select transistor GST connected to the common source line CSL, a sting select transistor SST connected to the bit line BL, and a plurality of memory cell transistors MCT between the ground select transistor GST and the string select transistor SST. The ground select transistor GST, the plurality of memory cell transistors MCT, and/or the string select transistor SST may be connected in series. The common source line CSL may be commonly connected to sources of ground select transistors GSL. A ground select line GSL, a plurality of word lines WL1~WLn, and a plurality of string select lines SSL that are disposed between the common source line CSL and the bit lines BL may respectively serve as gate electrodes of the ground select transistor GST, the memory cell transistors MCT, and the string select transistor SST. Each of the memory cell transistors MCT may include a data storage element.

The memory cell array according to example embodiments of the inventive concepts may include gate induced drain leakage (GIDL) transistors GIDLT for performing an erase operation of the memory cell array using a GIDL method. The GIDL transistors GIDLT may be disposed between the string select lines SSL and the bit lines BL, and thus may refer to "upper GIDL transistors". In some example embodiments, "lower GIDL transistors" may be further disposed between the ground select line GSL and the common source line CSL. A GIDL gate line GIDLGL serving as a gate electrode of the GIDL transistors GIDLT may be disposed between the string select line SSL and the bit line BL.

To implement the GIDL transistors GIDLT (e.g., the upper GIDL transistors), a portion of a channel region of the transistor adjacent to a drain region thereof may be doped with high concentration dopants. In general, an abrupt junction may be formed by injecting dopants in the portion of the channel region of the transistor using an implantation process and performing a subsequent heat treatment for diffusing and activating the dopants. For example, to obtain sufficient GIDL current, a high dose implantation process may be repeatedly conducted several times. An upper insulation layer (e.g., an oxide layer) may be damaged due to the high dose implantation processes. The damaged portion of the upper insulation layer is etched in a subsequent etch process, and thus defects, such as formation of a parasitic word line, may be generated. The GIDL transistors GIDLT according to example embodiments of the inventive concepts may be implemented without using the high dose implantation process.

Figure 3A:
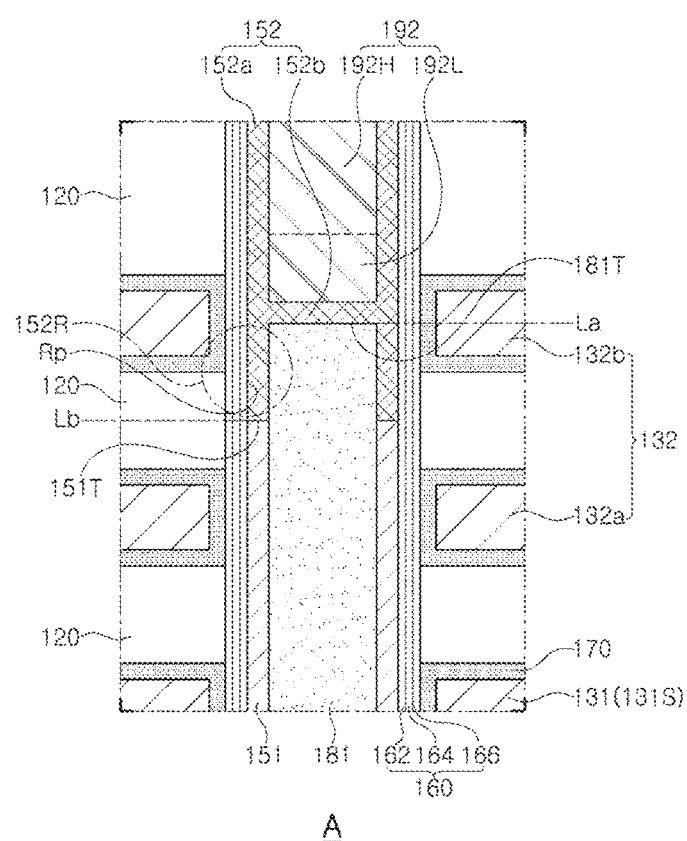
FIG. 3A is an enlarged cross-sectional view of portion "A" of FIG. 2.
Figure 3B:
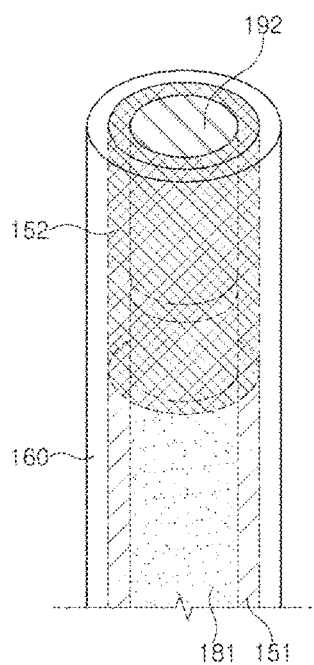
FIG. 3B is a transparent perspective view illustrating a vertical structure of FIG. 3A.

FIG. 2 is a schematic perspective view illustrating a memory cell array of a three dimensional semiconductor device according to example embodiments of the inventive concepts. FIG. 3A is an enlarged cross-sectional view of portion "A" of FIG. 2. FIG. 3B is a transparent perspective view illustrating a vertical structure of FIG. 3A.

Referring to FIG. 2, a 3D semiconductor device 100 may include a substrate 101 and a stack structure SS including insulation layers 120, a plurality of first gate electrodes 131, and/or second gate electrodes 132. Some of the insulation layers 120 and the plurality of first gate electrodes 131 may be alternately stacked on the substrate 101. The remainder of the insulation layers 120 and the second gate electrodes 132 may be alternately stacked on the plurality of first gate electrodes 131.

The substrate 101 may be, for example, a silicon substrate, a germanium substrate, or a silicon-germanium substrate.

The plurality of first gate electrodes 131 may include a lowermost gate electrode 131G, an uppermost gate electrode 131S, and cell gate electrodes 131-1, 131-2, . . . , and 131-$n$ vertically stacked therebetween. The lowermost gate electrode 131G and the uppermost gate electrode 131S may correspond to a gate electrode of the ground select transistor (see GST of FIG. 1) and a gate electrode of the string select transistor (see SST of FIG. 1), respectively.

The cell gate electrodes 131-1, 131-2, . . . , and 131-$n$ may correspond to gate electrodes of the memory cell transistors (see MCT of FIG. 1). In other words, the lowermost gate electrode 131G and the uppermost gate electrode 131S may serve as the ground select line (see GSL of FIG. 1) and the string select transistor (see SSL of FIG. 1), respectively, and the cell gate electrodes 131-1, 131-2, . . . , and 131-$n$ may serve as the word lines (see WL1~WLn of FIG. 1).

The number of the cell gate electrodes 131-1, 131-2, . . . , and 131-$n$ may be determined depending on an integration density of the 3D semiconductor device 100. For example, the number of the cell gate electrodes 131-1, 131-2, . . . , and 131-$n$ may be 30 or more.

The second gate electrodes 132 may include a lower gate electrode 132$a$ and an upper gate electrode 132$b$ that are sequentially stacked on the plurality of first gate electrodes 131. The second gate electrodes 132 may correspond to gate electrodes of the GIDL transistors (see GIDLT of FIG. 1). The second gate electrodes 132 may include two gate electrodes 132$a$ and 132$b$ as shown in FIG. 2, but the inventive concepts are not limited thereto. For example, the second gate electrodes 132 may include one or three or more gate electrodes.

The stack structure SS may extend in a X-Y plane having a first direction X and a second direction Y crossing the first direction X, in plan view. The plurality of first gate electrodes 131 and the second gate electrodes 132 may be sequentially stacked in a third direction Z perpendicular to the first direction X and the second direction Y. The first direction X and the second direction Y may be parallel to an upper surface of the substrate 101. The third direction Z may be perpendicular to the upper surface of the substrate 101. The plurality of first gate electrodes 131 and the second gate electrodes 132 may be spaced apart from each other by the insulation layers 120 interposed between respective ones of the plurality of first gate electrodes 131 and the second gate electrodes 132.

For example, each of the insulation layers 120 may include, a silicon layer, a silicon oxide layer, a silicon carbide layer, a silicon oxynitride layer, and/or a silicon nitride layer. For example, each of the plurality of first gate electrodes 131 and the second gate electrodes 132 may include polysilicon and/or metal such as tungsten, and/or a conductive metal nitride.

A lower insulation layer 102 may be disposed between the substrate 101 and the stack structure SS. The lower insulation layer 102 may include, for example, silicon oxide, silicon nitride, a high-k dielectric material (e.g., aluminum oxide, hafnium oxide, etc.), and/or a combination thereof. The lower insulation layer 102 may be thinner than each of the insulation layers 120. Thicknesses of the lower insulation layer 102 and the insulation layers 120 may be measured in the third direction Z.

The stack structure SS may include channel holes CH extending therethrough in the third direction Z. A vertical structure VS may be disposed in each of the channel holes CH. As shown in FIG. 2, the vertical structure VS (or each of the channel holes CH) may have the same or substantially the same width along the third direction Z, but the inventive concepts are not limited thereto. In some example embodiments, the vertical structure VS (or each of the channel holes CH) may taper as it approaches the substrate 101.

The vertical structure VS may include a vertical insulator 160, first and second channel structures 151 and 152 connected to each other in the vertical direction, a buried insulation pattern 181 that are disposed in the order close to the first and second gate electrodes 131 and 132. The vertical structure VS may pass through the stack structure SS and may be electrically connected to the substrate 101. The vertical structure VS may include a plurality of vertical structures disposed in the stack structure SS. The plurality of vertical structures VS may be arranged in the first direction X and the second direction Y, in plan view. The plurality of vertical structures VS may be arranged in a zigzag form in the first direction X.

Referring to FIGS. 2 and 3A, a channel structure may include the first channel structure 151 and the second channel structure 152 connected to each other in the third direction Z. A bottom end of the second channel structure 152 may be connected to a top end 151T of the first channel structure 151. The first channel structure 151 may pass through the plurality of first gate electrodes 131 and a portion of the second gate electrodes 132. The second channel structure 152 may pass through the remainder of the second gate electrodes 132.

For example, the first channel structure 151 may pass through the plurality of first gate electrodes 131 and the lower gate electrode 132a, and the second channel structure 152 may pass through the upper gate electrode 132b.

The first channel structure 151 may include an undoped semiconductor material, for example, undoped polysilicon. The second channel structure 152 may include an doped semiconductor material and/or a semiconductor material having a band gap smaller than a band gap of the first channel structure 151. For example, the second channel structure 152 may include doped polysilicon. A dopant concentration of the doped polysilicon in the second channel structure 152 may be in a range of 2~10 counts/cm$^3$ based on analysis of X-ray fluorescence (XRF). The semiconductor material having the relatively small band gap included in the second channel structure 152 may increase the GIDL efficiency and may include, for example, silicon germanium (SiGe) and/or germanium (Ge). In some example embodiments, the semiconductor material having the relatively small band gap may be doped. In some example embodiments, the second channel structure 152 may be formed by depositing a doped semiconductor material. In some example embodiments, the second channel structure 152 may be formed by depositing a semiconductor material and doping the semiconductor material through a subsequent process to have a desired dopant concentration.

The buried insulation pattern 181 may be disposed on a sidewall of the first channel structure 151, and the buried insulation pattern 181 may be surrounded by the first channel structure 151 in a plan view (or a sidewall of the buried insulation pattern 181 may be covered by the first channel structure 151). An upper surface 181T of the buried insulation pattern 181 may be located at a higher level than the top end 151T of the first channel structure 151 with respect to the upper surface of the substrate 101.

As shown in FIG. 3A, a level Lb of the top end 151T of the first channel structure 151 may be located higher than a level of an upper surface of the lower gate electrode 132a and lower than a level of a lower surface of the upper gate electrode 132b. However, the inventive concepts are not limited thereto. For example, the level Lb of the top end 151T of the first channel structure 151 may be variously changed according to a thickness and the number of the gate electrodes. In some example embodiments, referring to FIGS. 5, 6, and 7, the level Lb of the top end 151T of the first channel structure 151 may be selected in a range higher than the lower surface of the lower gate electrode 132a and lower than the upper surface of the upper gate electrode 132b.

An upper surface 181T of the buried insulation pattern 181 may be located at a level overlapped with the upper gate electrode 132b in a horizontal direction (or in the first direction X or the second direction Y) parallel to the upper surface of the substrate. In other words, a level La of the upper surface 181T of the buried insulation pattern 181 may be located above the level Lb of the top end 151T of the first channel structure 151. The buried insulation pattern 181 may include, for example, silicon oxide, silicon nitride, and/or silicon oxynitride.

Referring to FIG. 3B, each of the first channel structure 151 and the second channel structure 152 (e.g., a channel layer 152a) may have a hollow pipe shape or a macaroni shape. A bottom end of the first channel structure 151 may be closed.

Referring to FIG. 3A, the second channel structure 152 may include the channel layer 152a adjacent to the upper gate electrode 132b and an intermediate horizontal layer 152b on an upper surface of the buried insulation pattern 181. The channel layer 152a may include an extension portion 152R extending into a region Rp recessed around the buried insulation pattern 181 to be connected to the top end 151T of the first channel structure 151. A length of the extension portion 152R extending through the recessed region Rp may be appropriately set, such that a channel length of the GIDL transistor (see GIDLT of FIG. 1) for the GIDL generation may be precisely designed. A thickness of the second channel structure 152 (e.g., a thickness of the channel layer 152a) may be in a range of 30 Å~100 Å, for example, or a range of about 30 Å~about 100 Å.

When the terms "about," "substantially," or "approximately" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

A buried conductive pattern 192 may be disposed on a sidewall of the second channel structure 152 and may be surrounded by the second channel structure 152, in a plan view. The buried conductive pattern 192 may be disposed in a space defined by the second channel structure 152. The buried conductive pattern 192 may have a flat upper surface coplanar with an upper surface of the stack structure SS and may include a doped semiconductor material. The buried conductive pattern 192 may be provided as a pad region. In some example embodiments, since the buried conductive pattern 192 is doped from a top thereof, the buried conductive pattern 192 may include a first portion 192H including a semiconductor material doped at a high concentration and a second portion 192L including the semiconductor material doped at a low concentration or an undoped semiconductor material.

Referring to FIGS. 2 and 3A, the vertical insulator 160 may be disposed between the stack structure SS and the first and second channel structures 151 and 152. The vertical insulator 160 may be interposed between each of the first and second gate electrodes 131 and 132 and each of the first and second channel structures 151 and 152. In some example embodiments, the vertical insulator 160 may extend between each of the insulation layers 120 and each of the first and second channel structures 151 and 152. The vertical insulator 160 may have a pipe or macaroni shape with an opened top and bottom.

The vertical insulator 160 may include an memory element of a flash memory device. For example, the vertical insulator 160 may include a charge storage layer 164 of the flash memory device. Data stored in the vertical insulator 160 may be changed using Fowler-Nordheim tunneling caused by voltage difference between the first channel structure 151 and the first gate electrodes 131 adjacent thereto. In some example embodiments, the vertical insulator 160 may include a thin layer capable of storing an information based on another operation principle, for example a thin layer for a phase change memory or a variable resistance memory.

The vertical insulator 160 may further include a tunnel insulation layer 162 between the charge storage layer 164 and the first and second gate electrodes 131 and 132. The tunnel insulation layer 162 may directly contact the first and second channel structures 151 and 152. In some example embodiments, the vertical insulator 160 may further include a blocking layer 166 between the charge storage layer 164 and the first and second gate electrodes 131 and 132. The charge storage layer 164 may include, for example, at least one of a silicon nitride layer, a silicon oxynitride layer, a silicon-rich nitride layer, a nanocrystalline silicon layer, and a laminated trap layer. The tunnel insulation layer 162 may include a material having a band gap larger than a band gap of the charge storage layer 164. For example, the tunnel insulation layer 162 may be a silicon oxide layer. The blocking layer 166 may include a material having a band gap larger than the band gap of the charge storage layer 164. The blocking layer 166 may include a silicon oxide layer, a silicon nitride layer, and/or a silicon oxynitride layer.

The vertical insulator 160 may further include a capping layer (not shown) between each of the insulation layers 120 and each of the first and second gate electrodes 131 and 132. The capping layer may directly contact the insulation layers 120 and may be separately disposed by the first and second gate electrodes 131 and 132. In some example embodiments, the capping layer may vertically extend between adjacent ones of the first and second gate electrodes 131 and 132. The capping layer may have an etch selectivity with respect to the charge storage layer 164 and may include a different material from the insulation layers 120. For example, the capping layer may include at least one of a silicon oxide layer, a silicon oxide layer, a polysilicon layer, a silicon carbide layer, and/or a silicon nitride layer, which is different from the insulation layers 120.

Horizontal insulators 170 may each be provided on an upper surface and a lower surface of each of the first and second gate electrodes 131 and 132. Each of the horizontal insulators 170 may extend between each of the first and second gate electrodes 131 and 132 and the vertical insulator 160. Each of the horizontal insulators 170 may be comprised of one thin layer or a plurality of thin layers. In some example embodiments, each of the horizontal insulators 170 may include a blocking insulation layer of a charge-trap type flash memory transistor.

An epitaxial layer 140 may be disposed between the first channel structure 151 and the substrate 101 and may contact the first channel structure 151 and the substrate 101. The first channel structure 151 may be electrically connected to the substrate 101 through the epitaxial layer 140. The epitaxial layer 140 may be disposed in a recess region R of the substrate 101. The epitaxial layer 140 may fill the recess region R and may protrude above the upper surface of the substrate 101. For example, a height of an upper surface of the epitaxial layer 140 may be higher than a height of an upper surface of a lowermost gate electrode 131G and lower than a height of an upper surface of a next lowermost gate electrode 131-1, with respect to the upper surface of the substrate 101. The upper surface of the epitaxial layer 140 may have a upwardly tapered shape (e.g., may be inclined downward from its center to its side edges). The epitaxial layer 140 may be a semiconductor material layer formed by a selective epitaxial growth (SEG) process. The epitaxial layer 140 may include silicon (Si), germanium (Ge), and/or silicon germanium (SiGe) which is doped or undoped. In some example embodiments, the epitaxial layer 140 may be omitted, and thus a lower portion of the first channel structure 151 may be inserted into the substrate 101. Accordingly, the bottom end of the first channel structure 151 may contact the substrate 101. A lower surface of the vertical insulator 160 may contact the substrate 101.

As shown in FIG. 2, an electrode separation pattern 107 may be disposed at each of opposite sidewalls of the stack structure SS. The electrode separation pattern 107 may cover a common source region 105 disposed in the substrate 101. The electrode separation pattern 107 may include, for example, at least one of a silicon oxide layer, a silicon nitride layer, and a silicon oxynitride layer. The common source region 105 may serve as the common source line (see SSL of FIG. 1) and may be a impurity doped region. A spacer insulation layer 184 may be disposed between a sidewall of the stack structure SS and the electrode separation pattern 107. Wiring lines (e.g., bit lines 195) may be disposed on the stack structure SS and my traverse the stack structure SS. The bit lines 195 may be connected to the buried conductive pattern 192 provided as the pad region, through a contact plug 194. An interlayer insulation layer (not shown) may be disposed between the bit lines 195 and the stack structure SS. The contact plug 194 may pass through the interlayer insulation layer.

Figure 4:
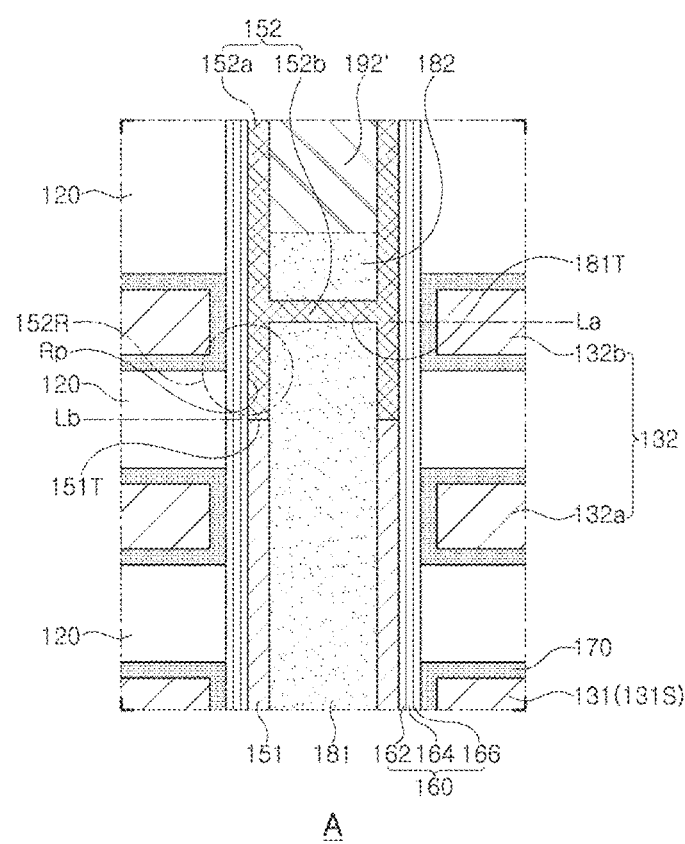
FIGS. 4, 5, 6, and 7 are cross-section views illustrating a three dimensional semiconductor device according to example embodiments of the inventive concepts.

The 3D semiconductor device 100 according to example embodiments of the inventive concepts may be variously modified. The pad region connected to each of the bit lines 195 may be modified to effectively prevent the dopants from diffusing from the second channel structure 152. A 3D semiconductor device having such a structure is illustrated in FIG. 4. FIG. 4 is an enlarged view of portion "A" of FIG. 2, similar to FIG. 3A.

Referring to FIG. 4, a 3D semiconductor device according to example embodiments of the inventive concepts may be the same as or similar to the 3D semiconductor device 100 shown in FIGS. 1 to 3B, except that a second buried insulation pattern 182 is additionally disposed between a buried conductive pattern 192' and the buried insulation pattern 181. The same reference numerals are used to denote the same elements as shown in FIGS. 1 to 3B.

The 3D semiconductor device according to example embodiments of the inventive concepts may further include the second buried insulation pattern 182 between the buried conductive pattern 192' and the first buried insulation pattern 181. The second channel structure 152 may include the intermediate horizontal layer 152b on the upper surface 181T of the first buried insulation pattern 181. The second buried insulation pattern 182 may be surrounded (e.g., a sidewall of the second buried insulation pattern 182 may be covered) by the channel layer 152a of the second channel structure 152 and may be disposed between the intermediate horizontal layer 152b and the buried conductive pattern 192'. For example, the buried conductive pattern 192' may be provided as the pad region and/or may include a semiconductor material doped at a high concentration. For example, the second buried insulation pattern 182 may include silicon oxide, silicon nitride, and/or silicon oxynitride. The second buried insulation pattern 182 may include the same material as the first buried insulation pattern 181.

In the cross-section shown in FIG. 3A, when the buried conductive pattern 192 is doped from its top, depending on a buried depth and a doping condition of the buried conductive pattern 192. The first portion 192H is doped at a high concentration, but the second portion 192L may be doped at a low concentration or may be undoped. In some example embodiments, the dopants may be diffused from the second channel structure 152 doped at a desired concentration into the second portion 192L. However, in some example embodiment of the inventive concepts, since a region corresponding to the second portion 192L of the buried conductive pattern 192 is formed of an insulating material, variation of a threshold voltage due to the diffusion of the dopants may be reduced or prevented.

The 3D semiconductor device according to some example embodiment may be variously modified. For example, levels of the top end of the first channel structure 151 and the upper surface of the first buried insulation pattern 181 may be variously modified while satisfying conditions as follows, 1) the top end of the first channel structure 151 is recessed lower than the upper surface of the first buried insulation pattern 181, 2) a portion of at least one second gate electrode 132 (e.g., a portion of one second gate electrode 132 or some of the second gate electrodes 132) is overlapped with the first channel structure 151 in the horizontal direction, and 3) the other portion of at least one second gate electrode 132 is overlapped with the second channel structure 152 in the horizontal direction.

Figure 5:
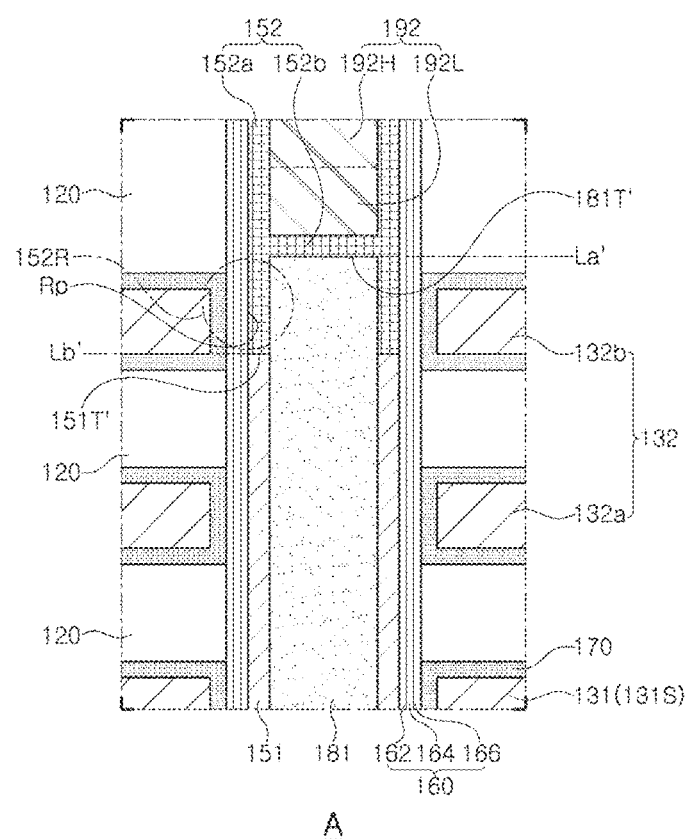
Figure 6:
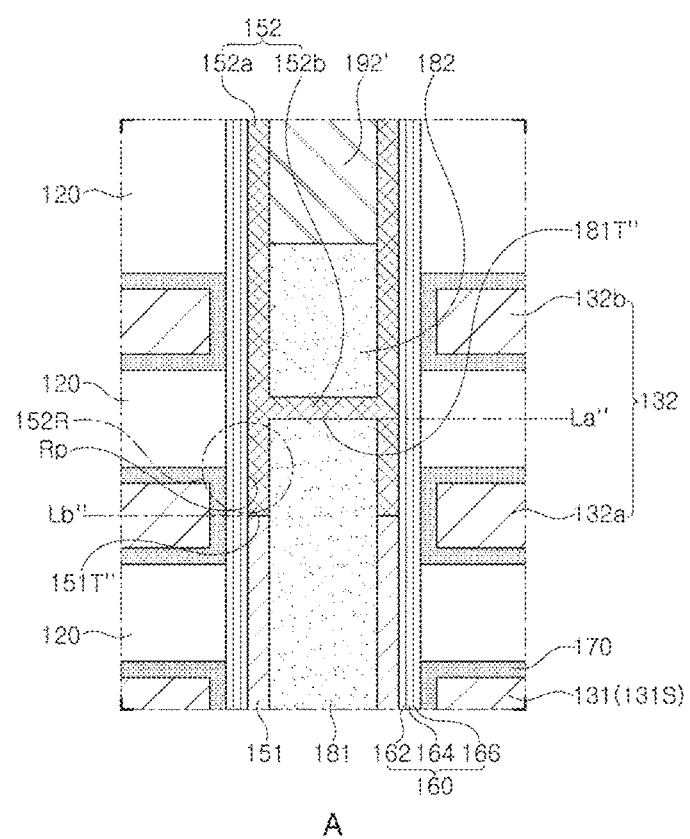

FIGS. 5, and 6 are cross-section views illustrating a three dimensional semiconductor device according to example embodiments of the inventive concepts and are enlarged views of portion "A" of FIG. 2.

Referring to FIG. 5, a 3D semiconductor device according to example embodiments of the inventive concepts may be the same as or similar to the 3D semiconductor device 100 shown in FIGS. 1 to 3B, except that levels La' and Lb' of a top end 151T' of the first channel structure 151 and an upper surface 181T' of the buried insulation pattern 181 are different from the levels La and Lb of some aforementioned example embodiments. The same reference numerals are used to denote the same elements as shown in FIGS. 1 to 3B.

The level La' of the upper surface 181T' of the buried insulation pattern 181 may be higher than the level La of that of some aforementioned example embodiments. In other words, the upper surface 181T' of the buried insulation pattern 181 may be located at a level the same as, substantially the same as, or higher than the upper surface of the upper gate electrode 132b. As shown in FIG. 5, the second channel structure 152 may extend through almost the upper gate electrode 132b. However, the level Lb' of the top end 151T' of the first channel structure 151 may be located lower than the upper surface of the upper gate electrode 132b.

Referring to FIG. 6, a 3D semiconductor device according to example embodiments of the inventive concepts may be the same as or similar to the 3D semiconductor device 100 shown in FIGS. 1 to 3B, except that levels La" and Lb" of a top end 151T" of the first channel structure 151 and an upper surface 181T" of the first buried insulation pattern 181 are different from the levels La and Lb of those of some aforementioned example embodiments and the second buried insulation pattern 182 is additionally disposed between the buried conductive pattern 192' and the first buried insulation pattern 181. The same reference numerals are used to denote the same elements as shown in FIGS. 1 to 3B.

The level La" of an upper surface 181T" of the first buried insulation pattern 181 may be lower than the level La of that of some aforementioned example embodiments. The level La" of the upper surface 181T" of the first buried insulation pattern 181 may be located lower than the lower surface of the upper gate electrode 132b and higher than an upper surface of the lower gate electrode 132a. In some example embodiments, the level Lb" of the top end 151T" of the first channel structure 151 may be lower than a level of the upper surface of the lower gate electrode 132a and higher than a level of the lower surface of the lower gate electrode 132a.

The second buried insulation pattern 182 may be surrounded (e.g., a sidewall of the second buried insulation pattern 182 may be covered) by the channel layer 152a of the second channel structure 152 and/or may be disposed between the buried conductive pattern 192' and the intermediate horizontal layer 152b, similar to that shown in FIG. 4. For example, since the buried conductive pattern 192' is provided as the pad region, the buried conductive pattern 192' may include a semiconductor material doped at a high concentration. For example, the second buried insulation pattern 182 may include silicon oxide, silicon nitride, and/or silicon oxynitride. Since the upper surface 181T" of the first buried insulation pattern 181 is located at a lower level than that of some aforementioned example embodiments, the channel layer 152a of the second channel structure 152 may extend relatively lengthwise. The diffusion of the dopants from the channel layer 152a may be effectively reduced or prevented by the second buried insulation pattern 182. Thus, to get the above effect, the second buried insulation pattern 182 may be formed to protrude above the upper surface of the upper gate electrode 132b.

In some aforementioned embodiments, the second gate electrode 132 for generating the GIDL may include two gate electrodes disposed on the stack structure SS. However, the second gate electrode 132 for generating the GIDL may include one or three or more gate electrodes disposed on the stack structure SS. In some example embodiments, like the above conditions, 1) the top end of the first channel structure 151 is recessed lower than the upper surface of the first buried insulation pattern 181, 2) a portion of at least one second gate electrode 132 (e.g., a portion of one second gate electrode 132 or some of the second gate electrodes 132) is overlapped with the first channel structure 151 in the horizontal direction, and 3) the other portion of at least one second gate electrode 132 is overlapped with the second channel structure 152 in the horizontal direction.

Figure 7:
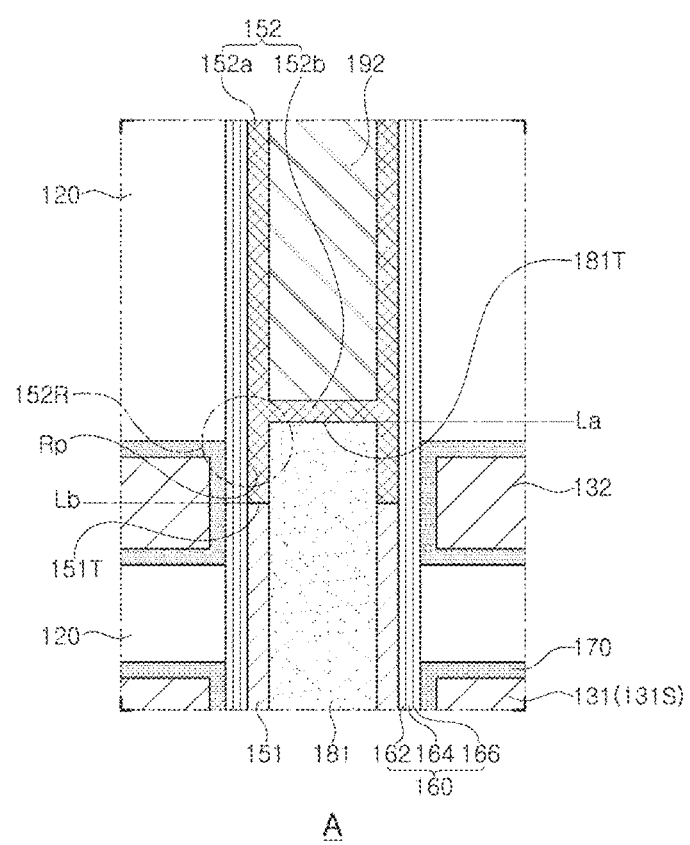

FIG. 7 illustrates a 3D semiconductor device according to example embodiments of the inventive concepts and illustrates one gate electrode for generating the GIDL disposed at an upper layer of the stack structure.

Referring to FIG. 7, a 3D semiconductor device according to example embodiments of the inventive concepts may be the same as or similar to the 3D semiconductor device 100 shown in FIGS. 1 to 3B, except that the levels La and Lb of the top end 151T of the first channel structure 151 and the upper surface 181T of the buried insulation pattern 181 are changed and the second gate electrode 132 includes one gate electrode. The same reference numerals are used to denote the same elements as shown in FIGS. 1 to 3B.

The second gate electrode 132 may include one gate electrode. The second gate electrode 132 (e.g., a lower portion of the second gate electrode 132) may be overlapped with the first channel structure 151 in the horizontal direction. The other portion (e.g., an upper portion) of the second gate electrode 132 adjacent to a channel required for inducing the GIDL may be overlapped with the second channel structure 152 in the horizontal direction. However, the inventive concepts are not limited thereto. For example, to form the second channel structure 152, the upper surface of the buried insulation pattern 181 may be located at a level same as, substantially the same as, or higher than the upper surface of the second gate electrode 132.

In some example embodiments, the second gate electrode 132 may include a plurality of gate electrodes (e.g., three or more gate electrodes) sequentially stacked on the plurality of first gate electrodes 131.

In some example embodiments, the top end of the first channel structure 151 may be located at a level higher than a lower surface of a lowermost one of the plurality of second gate electrodes 132 and lower than an upper surface of an uppermost one of the plurality of second gate electrodes 132.

Specifically, the first channel structure 151 may vertically extend through some of the plurality of second gate electrodes 132 adjacent to the first gate electrodes 131, and the second channel structure 152 may vertically extend through the remainder of the plurality of second gate electrodes 132.

In the case of three or more second gate electrodes 132, since a relatively long channel region is required to generate the GIDL, the upper surface of the buried insulation pattern 181 may be located at a lower level than the upper surface of the uppermost one of the second gate electrodes 132.

FIGS. 8, 9, 10, and 11 are cross-sectional views illustrating stages in a method of manufacturing a three dimensional semiconductor device according to example embodiments of the inventive concepts and are cross-sectional views taken along an X-Z plane of the 3D semiconductor device 100 of FIG. 2.

Figure 8:
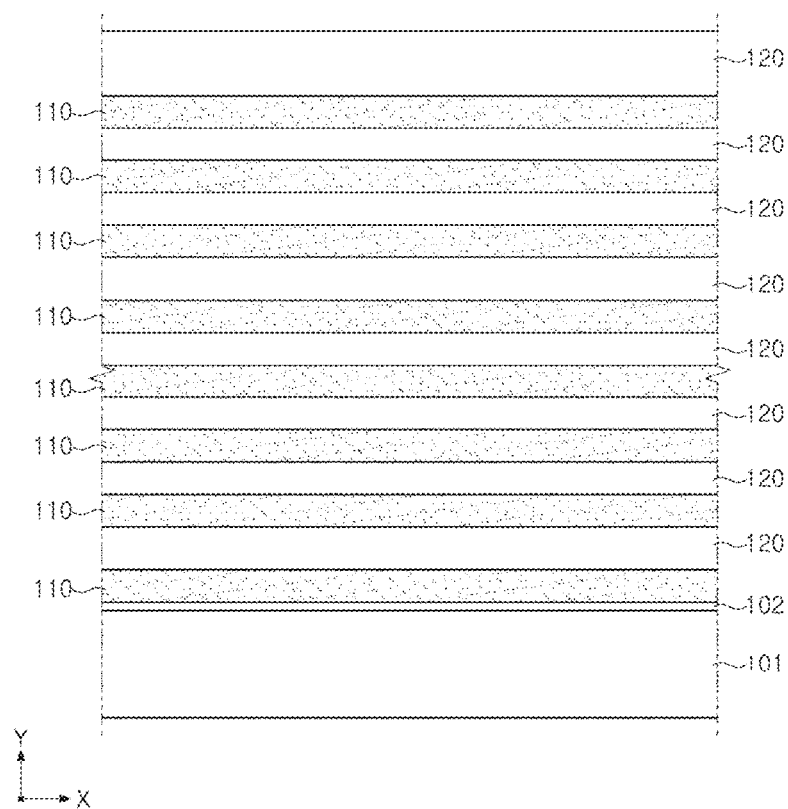
FIGS. 8, 9, 10, and 11 are cross-sectional views illustrating stages in a method of manufacturing a three dimensional semiconductor device according to example embodiments of the inventive concepts.

Referring to FIG. 8, the lower insulation layer 102 may be formed on the substrate 101. Sacrificial layers 110 and the insulation layers 120 may be alternately stacked on the lower insulation layer 102.

The substrate 101 may be, for example, a silicon substrate, a germanium substrate, and/or a silicon-germanium substrate. The lower insulation layer 102 may be a silicon oxide layer formed by an oxidation process or a deposition process, for example.

The sacrificial layers 110 may be formed of a material having an etch selectivity with respect to the insulation layers 120. For example, each of the insulation layers 120 may include silicon oxide and/or silicon nitride. Each of the sacrificial layers 110 may include a material different from the insulation layers 120, for example, silicon, silicon oxide, silicon carbide, and/or silicon nitride.

A thickness of the lower insulation layer 102 and a thickness of each of the insulation layers 120 may be different. The thickness of the lower insulation layer 102 may be less than the thickness of each of the insulation layers 120. An uppermost one of the insulation layers 120 may be thick than the others of the insulation layers 120. The insulation layers 120 located over and below a word line region including word lines to be formed in a subsequent process may be formed relatively thick compared to the insulation layers 120 between the word lines. However, the inventive concepts are not limited thereto. The thicknesses and numbers of the insulation layers 120 and the sacrificial layers 110 may be variously changed.

Figure 9:
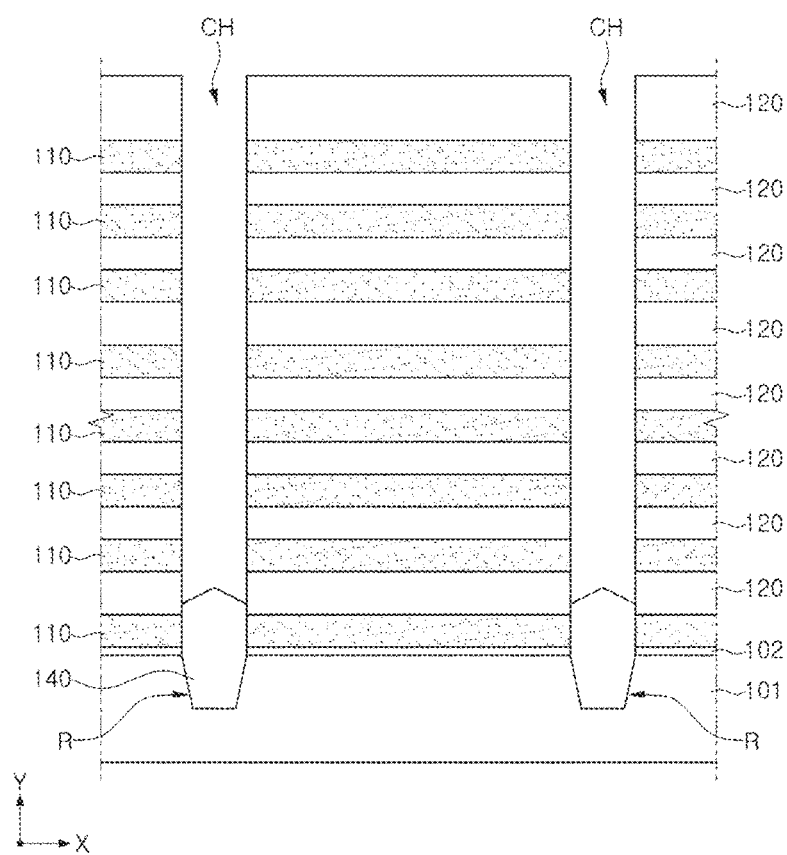

Referring to FIG. 9, the channel holes CH may be formed to pass through the sacrificial layers 110 and the insulation layers 120. The epitaxial layer 140 may be formed in the recess region R below each of the channel holes CH.

The channel holes CH may extend to the substrate 101 in a vertical direction (in the third direction Z) substantially perpendicular to an upper surface of the substrate 101, thereby forming the recess region R in the substrate 101. The channel holes CH may be formed by anisotropically etching the sacrificial layers 110 and the insulation layers 120. In some example embodiments, inner sidewalls of the channel holes CH may be not substantially perpendicular to the upper surface of the substrate 101. For example, a width of each of the channel holes CH may be reduced as it approaches the upper surface of the substrate 101.

The epitaxial layer 140 may be formed by performing a selective epitaxial growth process using the substrate 101 exposed in the recess region R as a seed. The epitaxial layer 140 may include a single layer or a plurality of layers grown at different growth conditions or having different compositions. The epitaxial layer 140 may be doped with dopants. For example, the epitaxial layer 140 may be doped with the dopants of the same conductivity type as or an opposite conductivity type from the substrate 101. An upper surface of the epitaxial layer 140 may be higher than an upper surface of the sacrificial layer 110 close to the substrate 101 with respect to the upper surface of the substrate 101.

Figure 10:
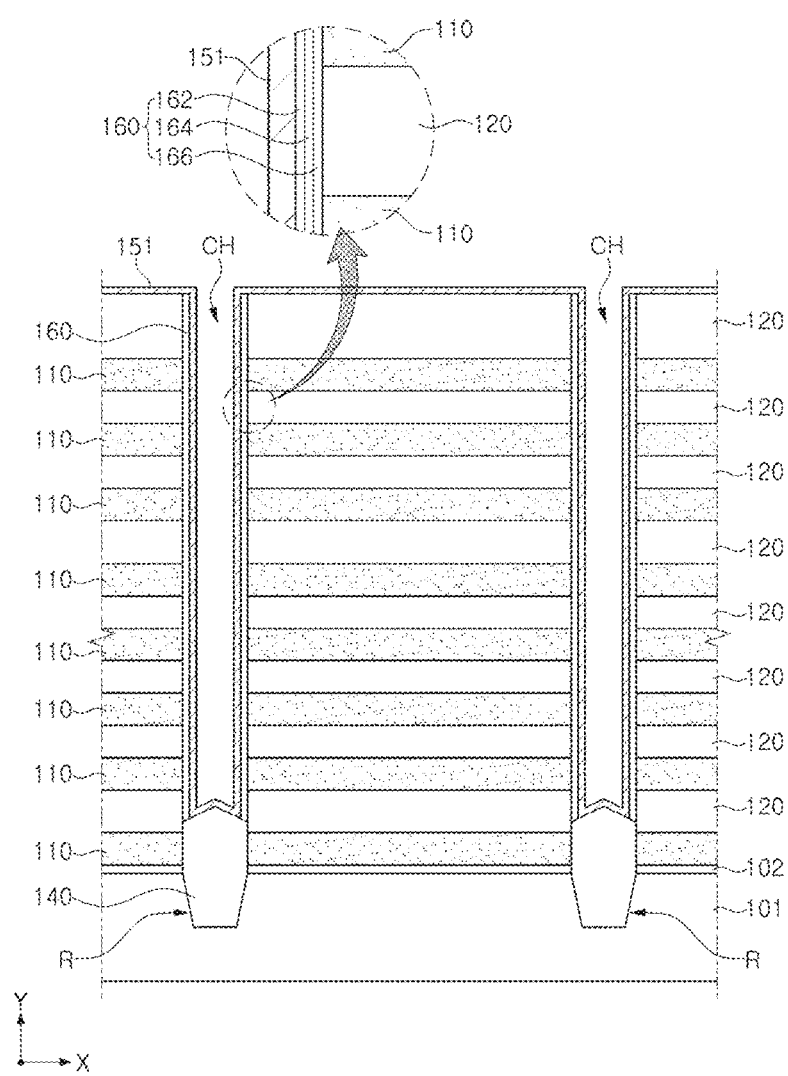

Referring to FIG. 10, the vertical insulator 160 and the first channel structure 151 may be sequentially formed on the inner sidewall of each of the channel holes CH.

The vertical insulator 160 may be conformally formed on the inner sidewall of each of the channel holes CH, the upper surface of the epitaxial layer 140, and an upper surface of the uppermost insulation layer 120, and then a portion of the vertical insulator 160 on the upper surface of the epitaxial layer 140 and the upper surface of the uppermost insulation layer 120 may be removed by an anisotropic etching process, such that the vertical insulator 160 may remain on the inner sidewall of each of channel holes CH. Thus, the upper surface of the epitaxial layer 140 may be exposed.

The vertical insulator 160 may be formed by sequentially depositing the blocking layer 166, the charge storage layer 164, and the tunnel insulation layer 162. The vertical insulator 160 may be formed by atomic layer deposition (ALD) or chemical vapor deposition (CVD).

Thereafter, the first channel structure 151 may be formed by ALD or CVD. The first channel structure 151 may be formed on the vertical insulator 160 and may contact the upper surface of the epitaxial layer 140. The first channel structure 151 may be formed on the upper surface of the uppermost insulation layer 120.

Figure 11:
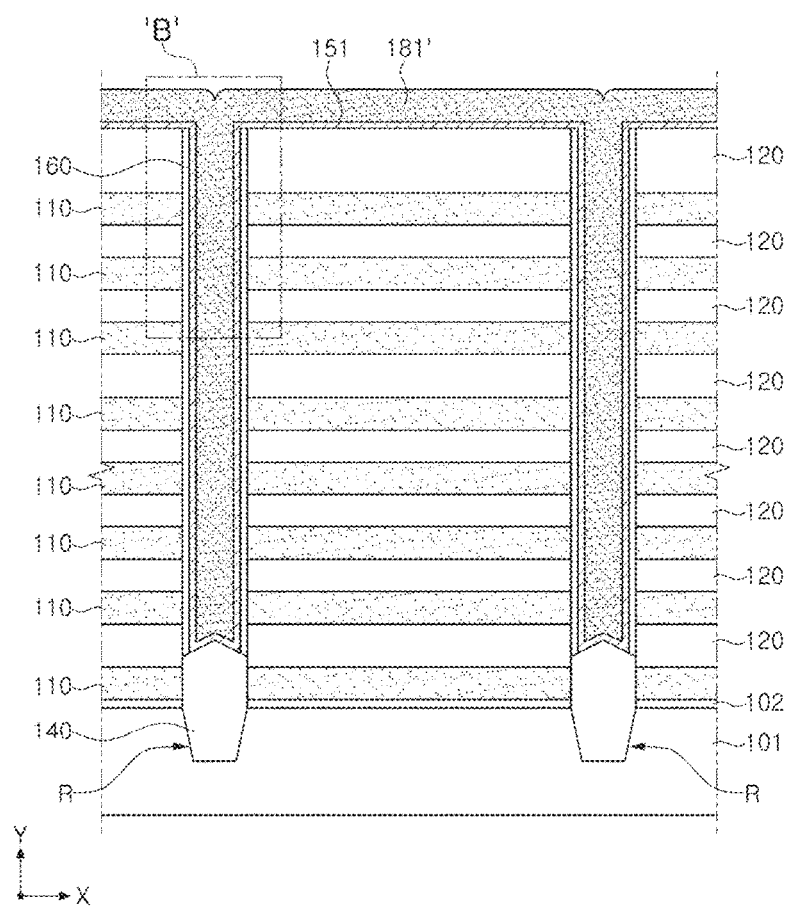

Referring to FIG. 11, a buried insulation layer 181' may be formed to fill each of the channel holes CH with the first channel structure 151.

The buried insulation layer 181' may be disposed on the uppermost insulation layer 120. For example, the buried insulation layer 181' may include silicon oxide, silicon nitride, and/or silicon oxynitride. In some example embodiments, the buried insulation layer 181' may be formed of a spin on glass (SOG) material.

Thereafter, a process of forming a second channel structure to implement a GIDL transistor may be performed. FIGS. 12A, 12B, 12C, and 12D are cross-sectional views illustrating processes to form the second channel structure according to example embodiments of the inventive concepts and are enlarged views of portion "B" of FIG. 11.

Figure 12A:
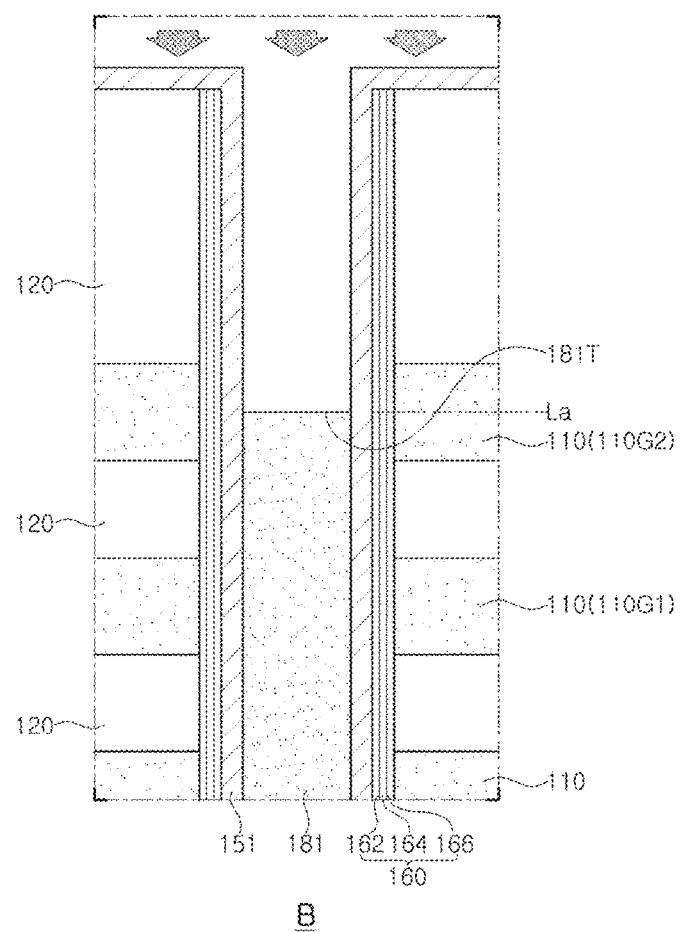
FIGS. 12A, 12B, 12C, and 12D are cross-sectional views illustrating processes (to form a second channel structure) in a method of manufacturing a three dimensional semiconductor device according to example embodiments of the inventive concepts.
Figure 12B:
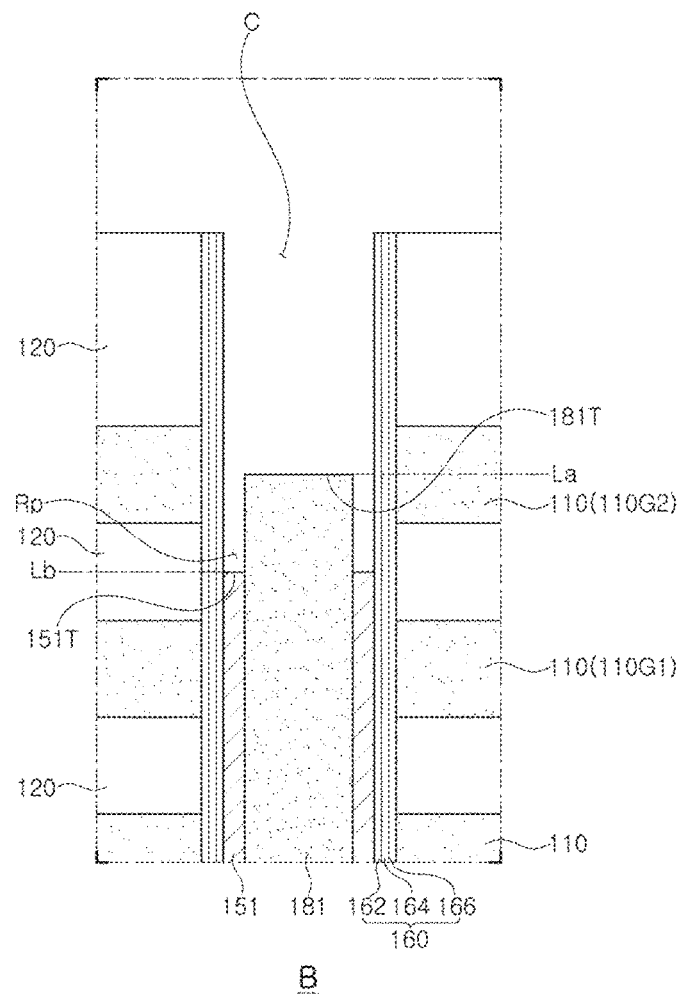

Referring to FIG. 12A, a portion of the buried insulation layer 181' may be removed to form the buried insulation pattern 181. An upper surface 181T of the buried insulation pattern 181 may be lowered to a level La by the removal of the portion of the buried insulation layer 181'.

Figure 16:
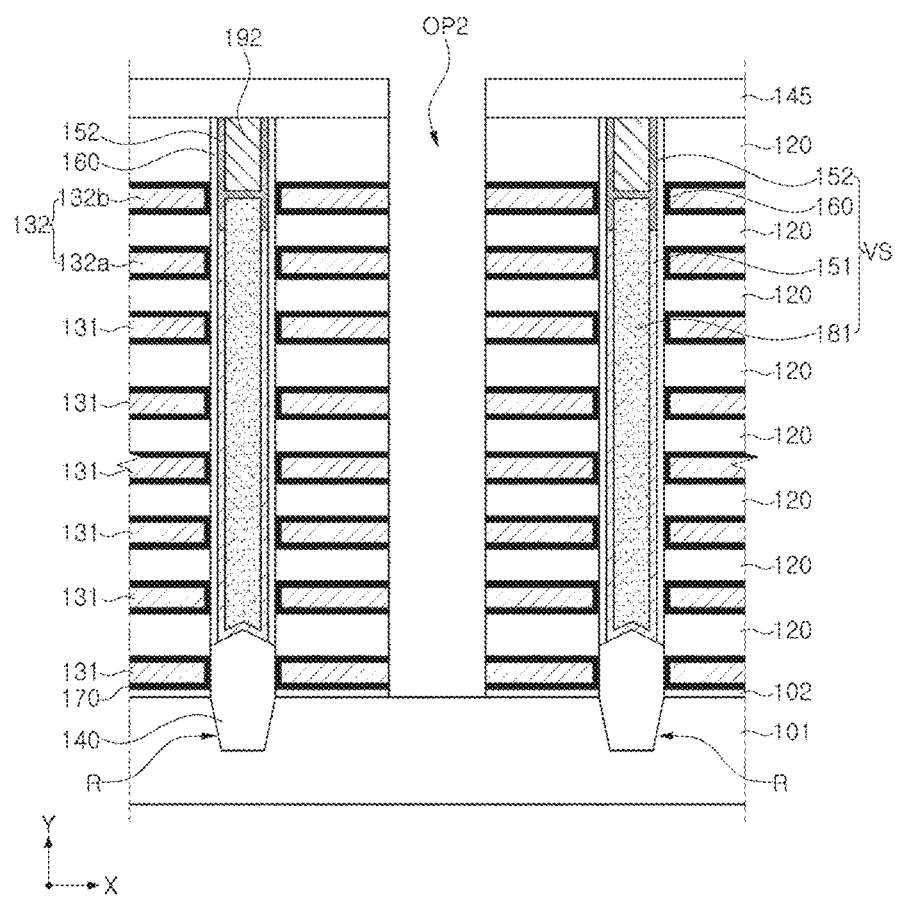

The removal of the portion of the buried insulation layer 181' may be performed by an etch back process. At that time, the portion of the buried insulation layer 181' on the uppermost insulation layer 120 may be removed. The level La of the upper surface 181T of the buried insulation pattern 181 may be overlapped with an uppermost sacrificial layer 110G2 of the sacrificial layers 110 corresponding to an upper gate electrode 132b of the second gate electrode 132 as shown FIG. 16 to be formed in a subsequent process, in the horizontal direction. A next uppermost sacrificial layer 110G1 may be a sacrificial layer corresponding to a lower gate electrode 132a of the second gate electrodes 132 as shown in FIG. 16 to be formed in the subsequent process. In some example embodiments, the level La of the upper surface 181T of the buried insulation pattern 181 may be appropriately adjusted to form a channel region of the transistor for generating the GIDL Referring to FIG. 12B, a portion of the first channel structure 151 may be removed, such that a top end 151T of the first channel structure 151 may be recessed lower than the upper surface 181T of the buried insulation pattern 181.

The channel region of the transistor for generating the GIDL may be determined. The level La of the upper surface 181T of the buried insulation pattern 181 may be adjusted first, and then the top end 151T of the first channel structure 151 may be recessed, such that the channel region of the transistor for the GIDL generation may be precisely defined.

Figure 12C:
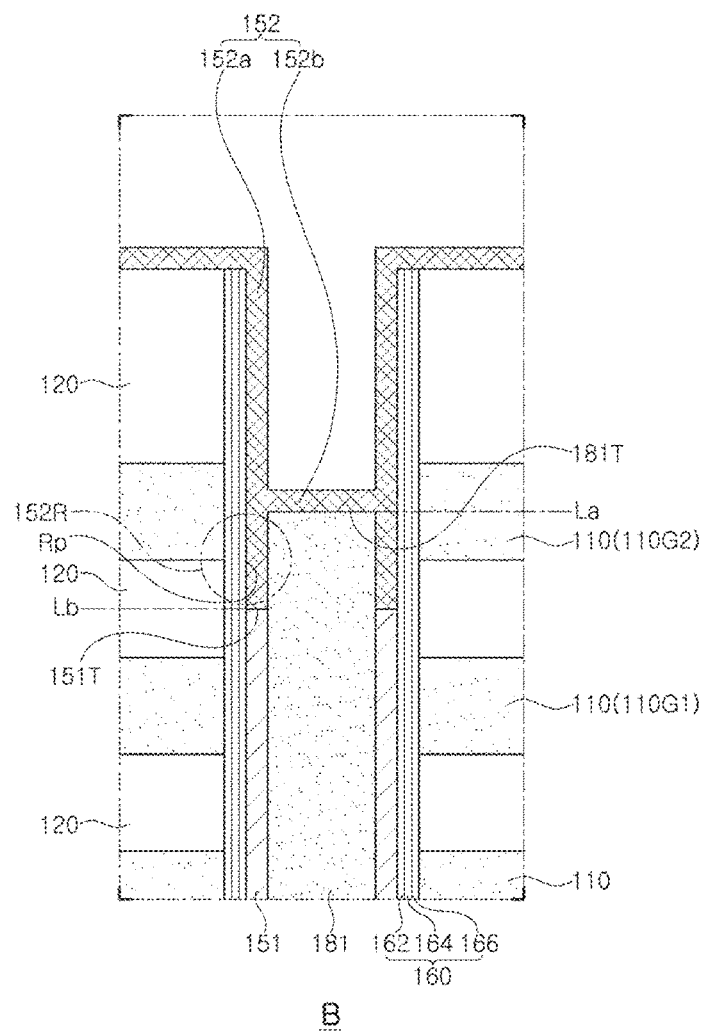

Referring to FIG. 12C, the second channel structure 152 may be formed on the inner sidewall of each of the channel holes CH to be connected to the first channel structure 151.

The second channel structure 152 may be formed in a region from which the first channel structure 151 is removed. The second channel structure 152 may be formed on the upper surface 181T of the buried insulation pattern 181. The second channel structure 152 may include the channel layer 152a serving as the channel region of the transistor and the intermediate horizontal layer 152b disposed on the upper surface 181T of the buried insulation pattern 181. The channel layer 152a of the second channel structure 152 may include an extension portion 152R formed in the region Rp recessed lower than the level La of the upper surface 181T of the buried insulation pattern 181 and may be connected to the top end 151T of the first channel structure 151 through the extension portion 152R.

The second channel structure 152 may include a doped semiconductor material, for example, doped polysilicon, and/or a semiconductor material having a smaller band gap than a band gap of a material of the first channel structure 151, for example, silicon germanium (SiGe) and/or germanium (Ge). The second channel structure 152 may be formed by depositing a doped semiconductor material or by depositing a semiconductor material and then doping the semiconductor material to have a desired dopant concentration.

Figure 12D:
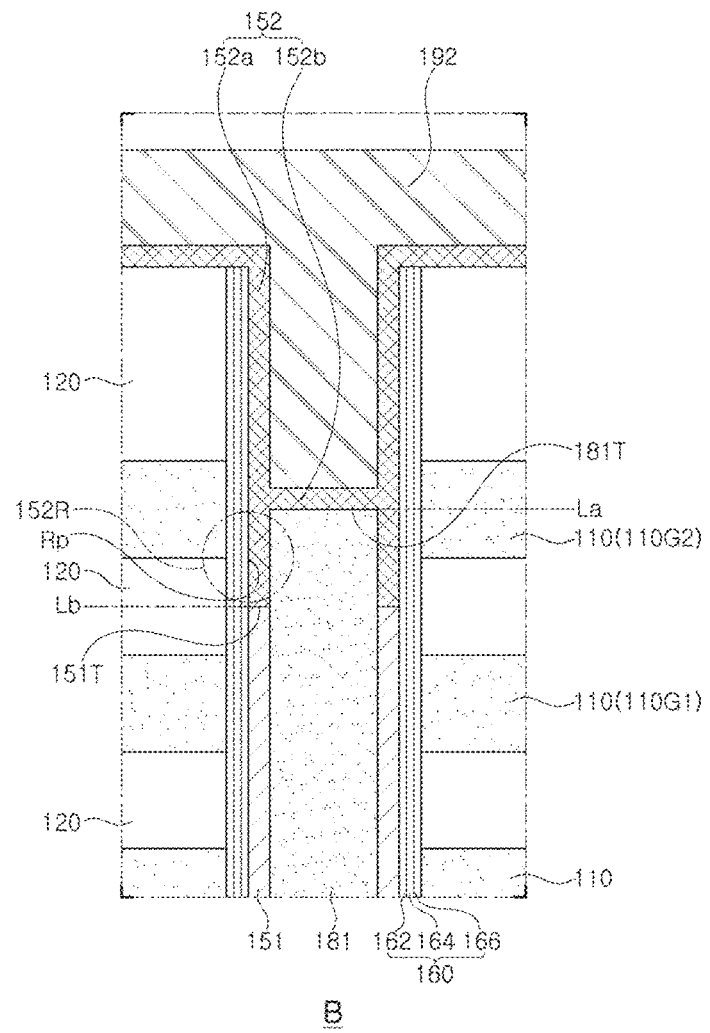

Referring to FIG. 12D, the buried conductive pattern 192 may be formed in each of the channel holes CH with the second channel structure 152, and at least a sidewall of the buried conductive pattern 192 may be surrounded (covered) by the second channel structure 152.

Figure 13:
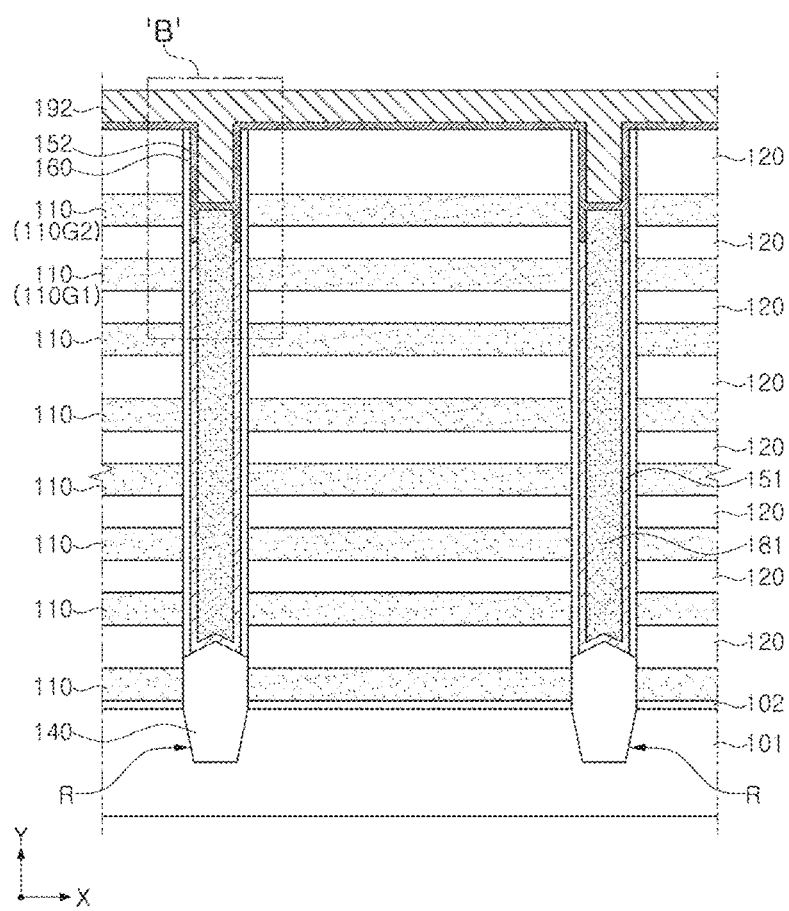
FIGS. 13, 14, 16, and 17 are cross-sectional views illustrating stages in a method of manufacturing a three dimensional semiconductor device according to example embodiments of the inventive concepts.

The buried conductive pattern 192 may be provided in a space defined by the second channel structure 152. For example, the buried conductive pattern 192 may be disposed on a sidewall of the second channel structure 152. An additional doping process may be performed on the buried conductive pattern 192, such that the buried conductive pattern 192 may be provided as a pad region. An additional buried insulation pattern 182 may be formed prior to forming the buried conductive pattern 192. For example, as shown in FIG. 4, the additional buried insulation pattern (the second buried insulation pattern) 182 may be formed in a lower portion of the space defined by the second channel structure 152, and then the buried conductive pattern 192 may be formed on the additional buried insulation pattern 182 to implement a dual pad region. It may be understood that the cross-section view of FIG. 12D is an enlarged view of portion "B" shown in FIG. 13.

Figure 14:
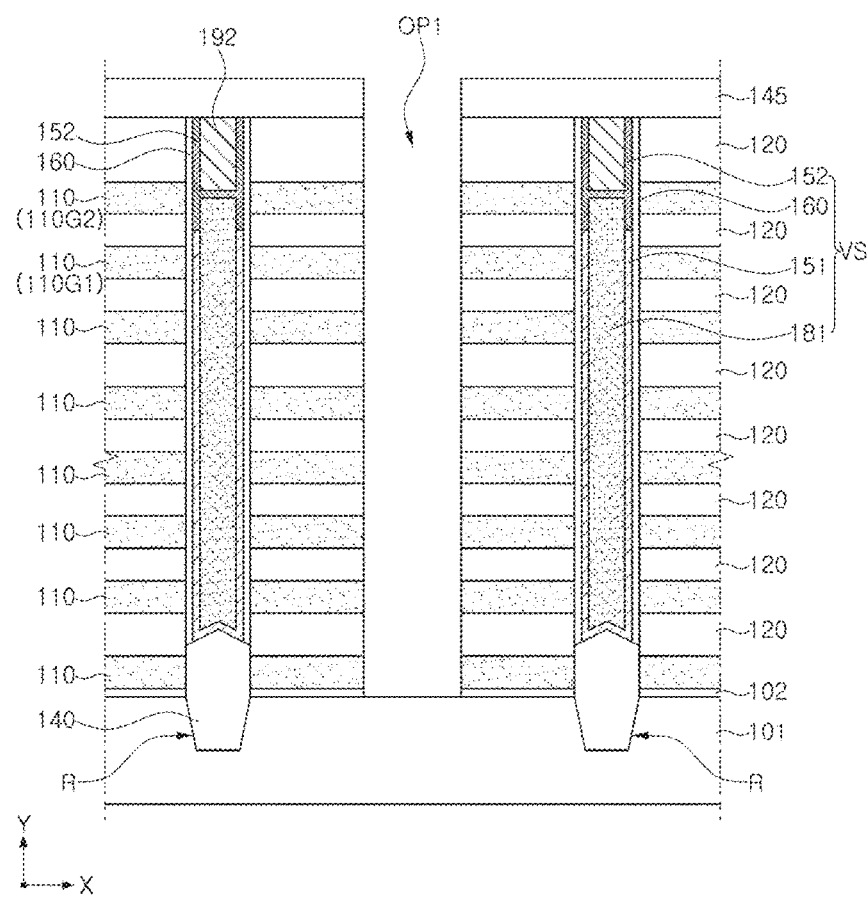

Referring to FIG. 14, a planarization process may be performed to expose an upper surface of the uppermost insulation layer 120. A first opening OP1 may be formed to pass through the sacrificial layers 110 and the insulation layers 120.

By the planarization process, a portion of the second channel structure 152 and a portion of the buried conductive pattern 192 that are on the uppermost insulation layer 120 may be removed. The planarization process may be performed by an etch back process or a chemical mechanical polishing process. The vertical insulator 160, the first and second channel structures 151 and 152, the buried insulation pattern 181 may comprise the vertical structure VS. A protection insulation layer 145 may be formed subsequent to the planarization process. The protection insulation layer 145 may protect the uppermost insulation layer 120, the buried conductive pattern 192, and the second channel structure 152 in a subsequent etching process. The first opening OP1 may be formed by forming a mask layer using a photolithography process and anisotropically etching the sacrificial layers 110 and the insulation layers 120 using the mask layer as an etch mask. The first opening OP1 may be a trench extending in the vertical direction (in the third direction Z). The first opening OP1 may expose a portion of the substrate 101.

Figure 15:
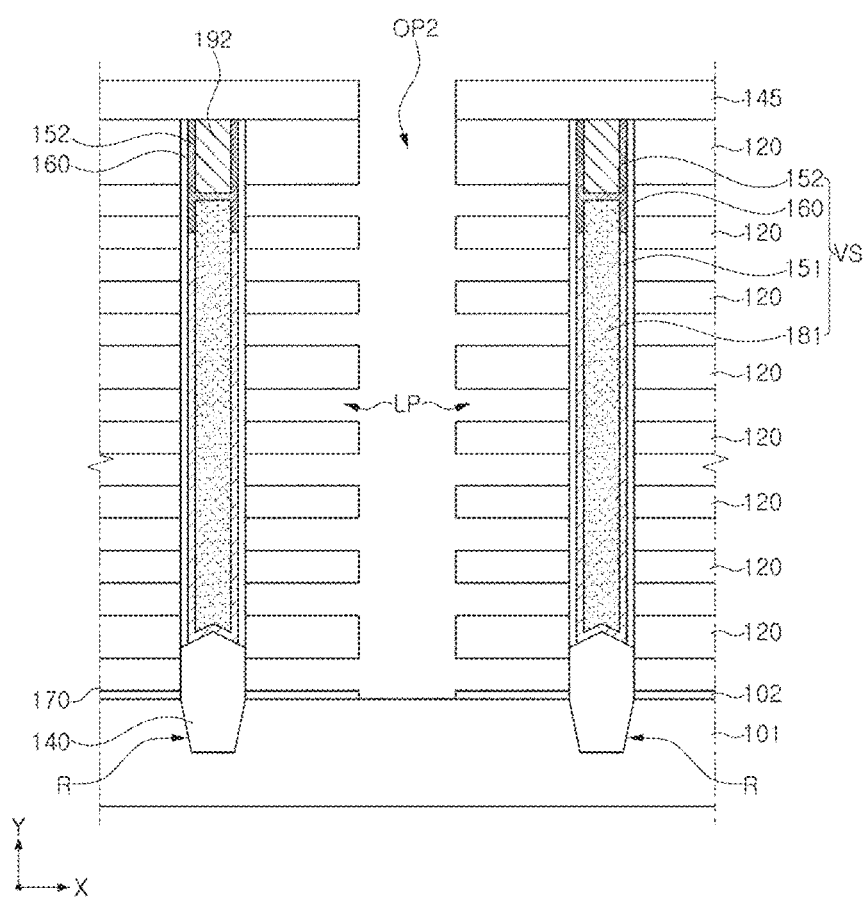

Referring to FIG. 15, the sacrificial layers 110 exposed by the first opening OP1 may be removed by an etching process to form a plurality of lateral openings LP.

The plurality of lateral openings LP may be respectively defined between the insulation layers 120 by the removal of the sacrificial layers 110.

Referring to FIG. 16, the horizontal insulators 170 and the first and second gate electrodes 131 and 132 may be formed in the plurality of lateral openings LP.

The horizontal insulators 170 may contact the vertical insulator 160 exposed in the horizontal openings LP.

Materials of the horizontal insulators 170 and the first and second gate electrodes 131 and 132 formed in the first opening OP1 may be removed to form a second opening OP2. As a result, the stack structure SS including the insulation layers 120 and the first and second gate electrodes 131 and 132 may be separately formed by the second opening OP2. The second gate electrodes 132 may include the lower gate electrode 132a and the upper gate electrode 132b over the lower gate electrode 132a.

Figure 17:
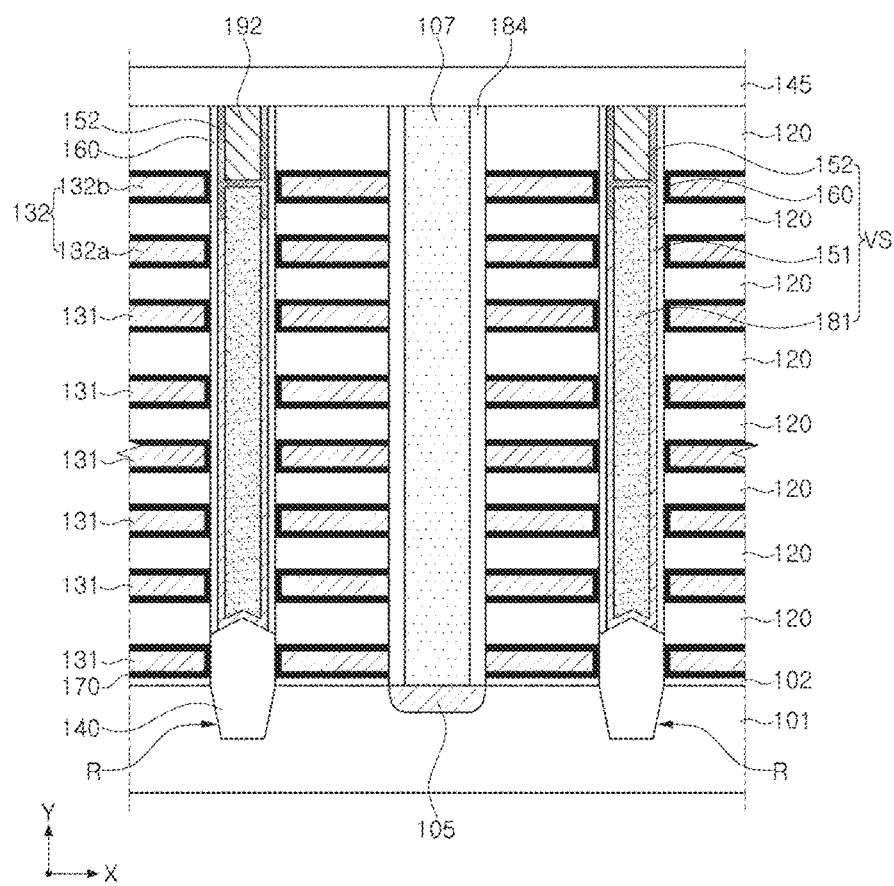

Referring to FIG. 17, the common source region 105 may be formed by injecting dopants into the substrate 101 exposed by the second opening OP2. The electrode separation pattern 107 may be formed on the common source region 105 and at each of opposite sidewalls of the stack structure SS. The spacer insulation layer 184 may be formed prior to forming the electrode separation pattern 107.

It will be understood that, as described herein, an element that is "on" another element may be "above" or "below" the other element. Additionally, it will be understood that, as described herein, an element that is "on" another element may be directly on the other element, such that the elements are in direct contact with each other, or may be indirectly on the other elements, such that the elements are isolated from direct contact with each other by one or more interposing structures and/or spaces.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

While the inventive concepts have been shown and described with reference to example embodiments thereof, it will be understood by those of ordinary skill in the art that various changes in form and details may be made thereto without departing from the spirit and scope of the inventive concepts as set forth by the following claims.

What is claimed is:

1. A method of manufacturing a three dimensional semiconductor device, the method comprising:
    forming a structure including insulation layers and sacrificial layers alternately stacked on a substrate;
    forming a channel hole passing through the structure;
    forming a first channel structure on an inner sidewall of the channel hole;
    forming a buried insulation pattern on the first channel structure in the channel hole;
    recessing an upper surface of the buried insulation pattern;
    removing a portion of the first channel structure, such that a top end of the first channel structure is recessed lower than the recessed upper surface of the buried insulation pattern;
    forming a second channel structure on the recessed top end of the first channel structure in the channel hole; and
    forming a buried conductive pattern on the second channel structure in the channel hole.

2. The method according to claim 1, wherein the recessed upper surface of the buried insulation pattern is the same as or higher than an upper surface of an uppermost sacrificial layer of the sacrificial layers.

3. The method according to claim 1, wherein the recessed upper surface of the buried insulation pattern is at a level lower than an upper surface of an uppermost sacrificial layer of the sacrificial layers.

4. The method according to claim 3, wherein the upper surface of the buried insulation pattern is at a level higher than an upper surface of a next uppermost sacrificial layer of the sacrificial layers.

5. The method according to claim 1, wherein the recessed top end of the first channel structure is lower than an upper surface of an uppermost sacrificial layer of the sacrificial layers.

6. The method according to claim 5, wherein the second channel structure is overlapped with a portion of at least the uppermost sacrificial layer in a horizontal direction parallel to an upper surface of the substrate.

7. The method according to claim 5, wherein the recessed top end of the first channel structure is higher than an upper surface of a next uppermost sacrificial layer of the sacrificial layers.

8. The method according to claim 5, wherein the recessed top end of the first channel structure is higher than a lower surface of a next uppermost sacrificial layer of the sacrificial layers.

9. The method according to claim 8, wherein the second channel structure is overlapped with a portion of at least the next uppermost sacrificial layer in a horizontal direction parallel to an upper surface of the substrate.

10. The method according to claim 1, wherein the forming the second channel structure includes forming the second channel structure on the recessed upper surface of the buried insulation pattern in the channel hole, the second channel structure having an intermediate horizontal layer on the upper surface of the buried insulation pattern.

11. The method according to claim 1, wherein the first channel structure includes an undoped semiconductor material, and the second channel structure includes a doped semiconductor material.

12. The method according to claim 11, wherein the forming the second channel structure is performed by depositing the doped semiconductor material.

13. The method according to claim 11, wherein the forming the second channel structure is performed by depositing a semiconductor material and then doping the semiconductor material to have a desired dopant concentration.

14. The method according to claim 1, wherein the second channel structure includes a semiconductor material having a smaller band gap than a band gap of a material of the first channel structure.

15. The method according to claim 1, wherein the buried conductive pattern include a doped semiconductor material.

16. A method of manufacturing a three dimensional semiconductor device, the method comprising: forming a structure including insulation layers and sacrificial layers alternately stacked on a substrate; forming a channel hole passing through the structure; forming a first channel structure on an inner sidewall of the channel hole; forming a buried insulation pattern on the first channel structure in the channel hole; recessing an upper surface of the buried insulation pattern; removing a portion of the first channel structure, such that a top end of the first channel structure is recessed lower than the recessed upper surface of the buried insulation pattern; forming a second channel structure on the recessed top end of the first channel structure and the recessed upper surface of the buried insulation pattern in the channel hole, by depositing a doped semiconductor material, wherein the second channel structure has an intermediate horizontal layer on the upper surface of the buried insulation pattern; and forming a buried conductive pattern on the second channel structure in the channel hole.

17. The method according to claim 16, further comprising forming an additional buried insulation pattern on the intermediate horizontal layer in the channel hole, before the forming of the buried conductive pattern.

18. The method according to claim 16, wherein a level of the recessed upper surface of the buried insulation pattern is between an upper surface and a lower surface of the uppermost sacrificial layer of the sacrificial layers.

19. The method according to claim 18, wherein the second channel structure is overlapped with a portion of at least the uppermost sacrificial layer in a horizontal direction parallel to an upper surface of the substrate.

20. A method of manufacturing a three dimensional semiconductor device, the method comprising:
    forming a structure including insulation layers and sacrificial layers alternately stacked on a substrate;
    forming a channel hole passing through the structure;
    forming a first channel structure on an inner sidewall of the channel hole;
    forming a buried insulation pattern on the first channel structure in the channel hole;
    recessing an upper surface of the buried insulation pattern;
    removing a portion of the first channel structure, such that a top end of the first channel structure is recessed lower than the recessed upper surface of the buried insulation pattern, the recessed top end of the first channel structure being lower than an upper surface of an uppermost sacrificial layer of the sacrificial layers;
    forming a second channel structure on the recessed top end of the first channel structure and the recessed upper surface of the buried insulation pattern in the channel hole, the second channel structure having an intermediate horizontal layer on the upper surface of the buried insulation pattern; and
    forming a buried conductive pattern on the second channel structure in the channel hole.

* * * * *